(12) United States Patent
Yu et al.

(10) Patent No.: US 9,620,591 B2
(45) Date of Patent: Apr. 11, 2017

(54) SEMICONDUCTOR STRUCTURES AND METHODS FOR MULTI-LEVEL WORK FUNCTION AND MULTI-VALUED CHANNEL DOPING OF NANOWIRE TRANSISTORS TO IMPROVE DRIVE CURRENT

(71) Applicant: Taiwan Semiconductor Manufacturing Company Limited, Hsinchu (TW)

(72) Inventors: Tsung-Hsing Yu, Taipei (TW); Yeh Hsu, Taoyuan County (TW); Chia-Wen Liu, Taipei (TW); Jean-Pierre Colinge, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/184,094

(22) Filed: Feb. 19, 2014

(65) Prior Publication Data

US 2015/0236092 A1 Aug. 20, 2015

(51) Int. Cl.
*H01L 29/06* (2006.01)
*H01L 29/66* (2006.01)
*H01L 29/775* (2006.01)
*H01L 29/40* (2006.01)
*H01L 29/49* (2006.01)
(Continued)

(52) U.S. Cl.
CPC ...... *H01L 29/0676* (2013.01); *H01L 29/1045* (2013.01); *H01L 29/401* (2013.01); *H01L 29/4983* (2013.01); *H01L 29/66439* (2013.01); *H01L 29/66666* (2013.01); *H01L 29/775* (2013.01); *H01L 29/7827* (2013.01)

(58) Field of Classification Search
CPC ............. H01L 29/775; H01L 29/66439; H01L 29/1045; H01L 29/4983; H01L 29/0676; H01L 29/401; H01L 29/66666; Y10S 14/053; Y10S 148/088; Y10S 257/00; Y10S 257/917
See application file for complete search history.

(56) References Cited

U.S. PATENT DOCUMENTS

| 6,235,560 B1 * | 5/2001 | Ma ..................... H01L 21/28255 257/E21.207 |
| 2014/0166981 A1 * | 6/2014 | Doyle ............... H01L 29/66666 257/24 |

* cited by examiner

*Primary Examiner* — Thanhha Pham
(74) *Attorney, Agent, or Firm* — Jones Day

(57) ABSTRACT

A semiconductor device with multi-level work function and multi-valued channel doping is provided. The semiconductor device comprises a nanowire structure and a gate region. The nanowire structure is formed as a channel between a source region and a drain region. The nanowire structure has a first doped channel section joined with a second doped channel section. The first doped channel section is coupled to the source region and has a doping concentration greater than the doping concentration of the second doped channel section. The second doped channel section is coupled to the drain region. The gate region is formed around the junction at which the first doped section and the second doped section are joined. The gate region has a first work function gate section joined with a second work function gate section. The first work function gate section is located adjacent to the source region and has a work function greater than the work function of the second work function gate section. The second work function gate section located adjacent to the drain region.

15 Claims, 12 Drawing Sheets

(51) Int. Cl.
*H01L 29/10* (2006.01)
*H01L 29/78* (2006.01)

SEMICONDUCTOR STRUCTURES AND METHODS FOR MULTI-LEVEL WORK FUNCTION AND MULTI-VALUED CHANNEL DOPING OF NANOWIRE TRANSISTORS TO IMPROVE DRIVE CURRENT

BACKGROUND

The technology described in this patent document relates generally to semiconductor devices and more particularly to nanowire semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Development of nanowire devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
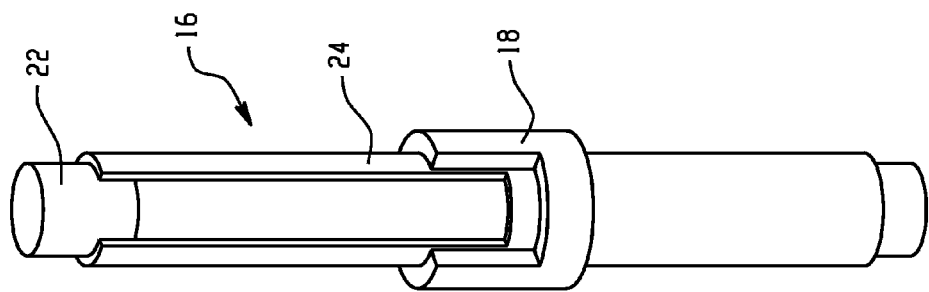
FIG. 1B is a diagram of an example nanowire structure that may be formed in the example semiconductor device of FIG. 1A, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
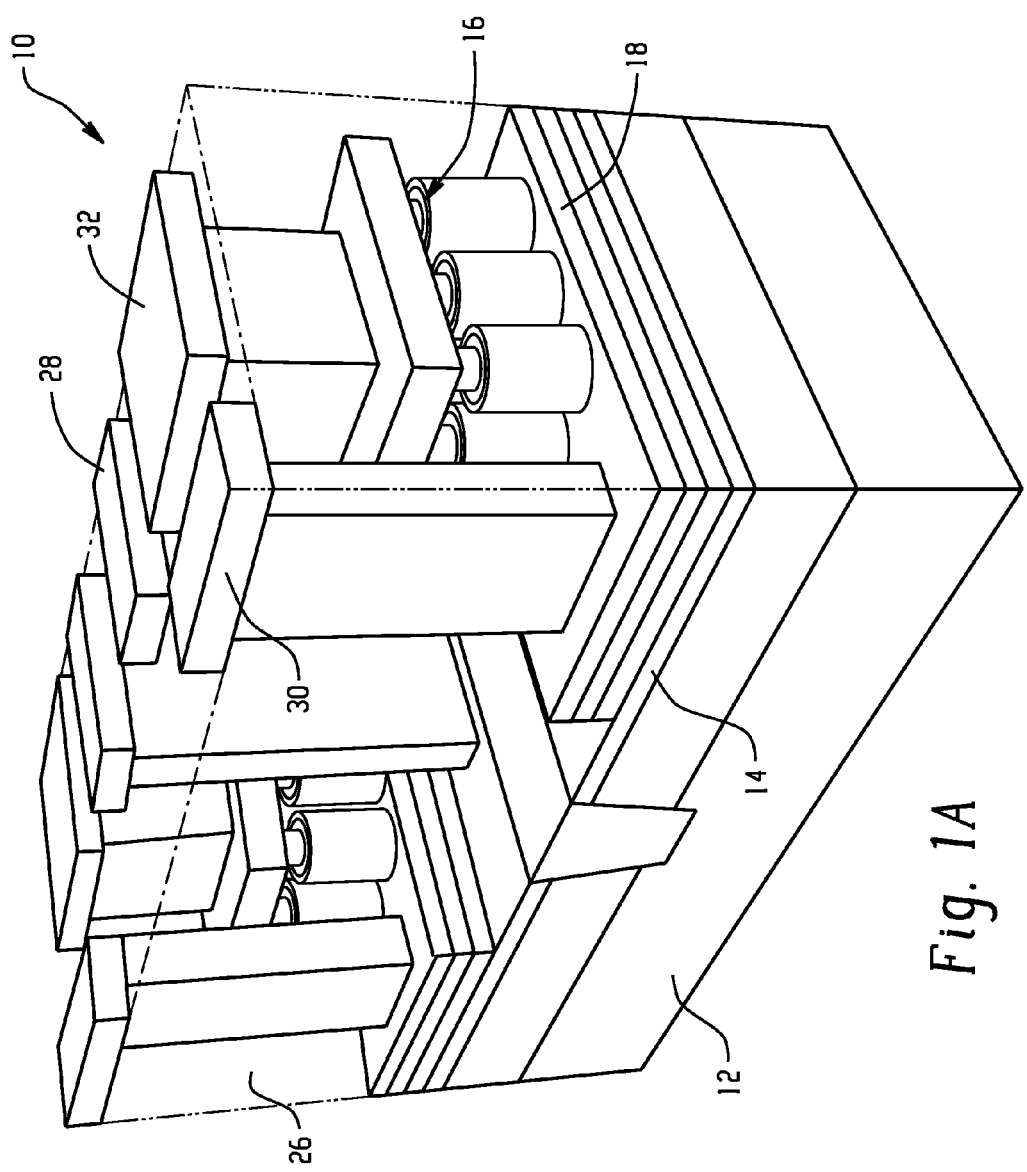
FIG. 1A is a diagram of an example semiconductor device that is formed using nanowire technology, in accordance with some embodiments.

FIG. 1A is a block diagram of an example semiconductor device 10 that is formed using nanowire technology. The device is fabricated on a substrate 12. In this example, the substrate 12 comprises a bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate 12 may include isolation regions, doped regions, and/or other features.

The example semiconductor device 10 further includes a source region 14 in the substrate 12, one or more nanowire structures 16, and gate material 18 above the substrate and surrounding a middle portion of the nanowire structures 16. The nanowire structures 16 in this example are oriented in a vertical direction and extend upwardly from the source region 14. In other examples, the nanowire structures may extend in other directions such as a horizontal direction. Also, although nanowires with a circular cross-sectional shape are shown in this example, in other examples the cross-sectional shape may include circular, square, rectangular, triangular, trapezoidal, or other shapes. The example nanowire structure 16, as illustrated in more detail in FIG. 1B, comprises semiconductor material such as silicon that is used to form a channel region between the source region 14 and a drain region 22. The drain region 22 in this example is at the far end section of the nanowire structure 16 opposite the source region 14 and may comprise a metal silicide. Gate oxide 24 is also shown surrounding the nanowire structure 16.

The example semiconductor device 10 further includes insulation material 26 above the substrate 12 and surrounding the nanowire structures 16 and gate material 18. Metal contacts are also included in the semiconductor device 10. In this example, shown are a source contact 28, a gate contact 30 and a drain contact 32.

The number of nanowires needed in a design may be a function of the drive current required for the semiconductor device. By increasing the drive current per nanowire, the number of nanowires required to produce the desired drive current may be reduced.

It has been determined that drive current (I) is equal to total channel charge (nq) multiplied by the average carrier velocity (v) and can be expressed by the following formula: I=nqv. To increase the drive current in the example nanowire devices, band structure engineering can be applied to increase the average carrier velocity through the modulation of the channel electric field.

Figure 2A:
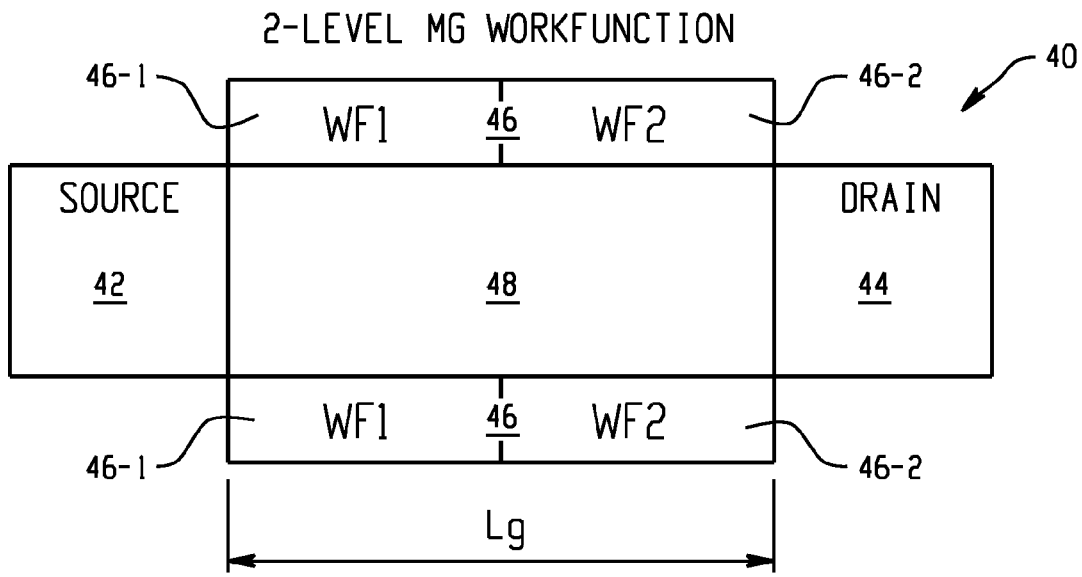
FIG. 2A is a diagram of another example semiconductor device having a channel formed from nanowire material.

FIG. 2A depicts an example semiconductor structure 40 that can be implemented using a nanowire. The semiconductor structure 40 comprises a source region 42, a drain region 44, and gate region 46 surrounding a nanowire structure 48. The gate region 46 has a total length $L_g$ and includes a first gate section 46-1 and a second gate section 46-2. The first gate section 46-1 is configured with a first work function WF-1, and the second gate section 46-2 is configured with a second work function WF-2.

Figure 2B:
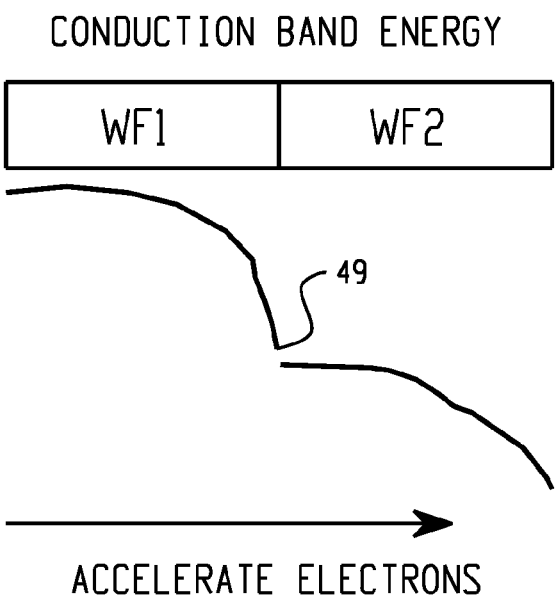
FIG. 2B is a diagram illustrating the relative levels of the conduction band energy $E_c$ for the semiconductor device of FIG. 2A at different locations in the nanowire channel.

FIG. 2B is a drawing that illustrates the effect of the different gate work functions on the conduction band energy $E_c$ of the nanowire channel for an electron that traverses the channel. The first gate section 46-1 and the second gate section 46-2 are each doped at different levels to generate different work functions for the two gate sections, wherein the second gate section has a higher work function than the first gate section. As an electron traverses the channel, the conduction band energy decreases. At the interface 49 between the two gate sections, the conduction band energy stabilizes due to the increased work function in the second gate section 46-2. As an electron continues past the interface 49 the conduction band energy begins to decline again. The work function differences in the two gate sections can cause the flow of electrons from the first gate section 46-1 to the second gate section 46-2 to accelerate. The carrier velocity will be enhanced by the work function induced electric field at the two gate section interface.

Figure 3A:
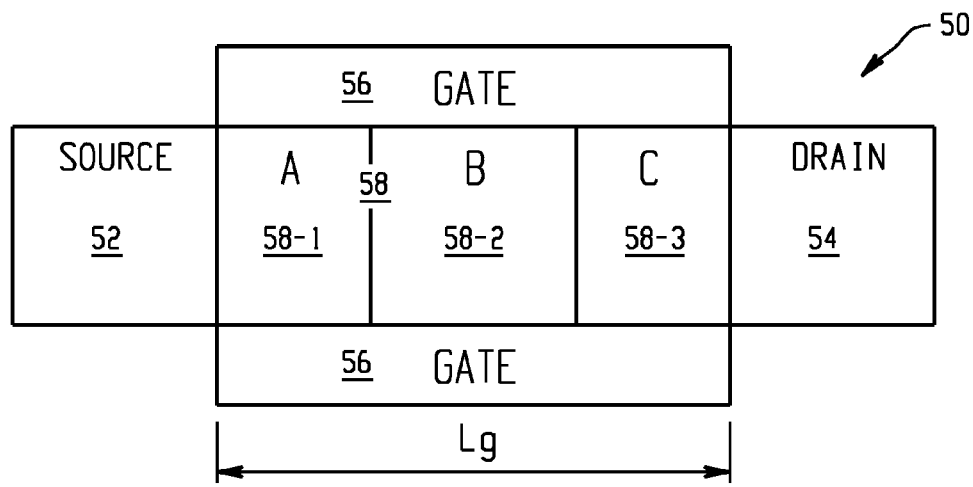
FIG. 3A is a diagram of another example semiconductor device having a channel formed from nanowire material.

FIG. 3A depicts another example semiconductor structure 50 that can be implemented using a nanowire. The semiconductor structure 50 comprises a source region 52, a drain region 54, and gate region 56 surrounding a nanowire structure 58. The gate region 56 has a total length Lg. The nanowire structure 58 includes a first nanowire section 58-1, a second nanowire section 58-2, and a third nanowire section 58-3.

Figure 3B:
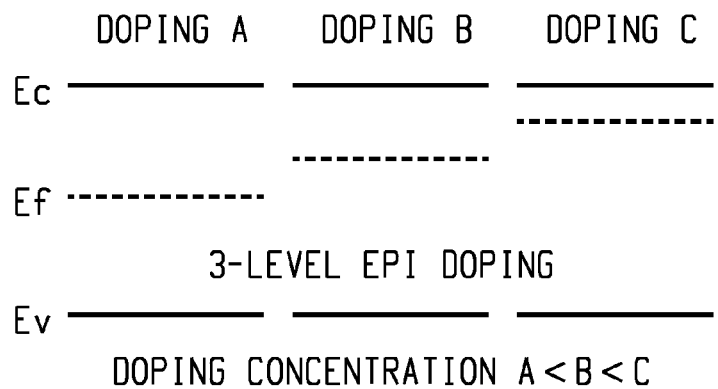
FIG. 3B is a diagram illustrating the relative levels of the Fermi energy level $E_F$ for each nanowire channel section for the semiconductor device of FIG. 3A.

FIG. 3B is a drawing that illustrates the relative Fermi energy level $E_f$ of the first nanowire section 58-1, the second nanowire section 58-2, and the third nanowire section 58-3 based on the doping level of the nanowire sections and without the nanowire sections being connected. The conduction band $E_c$ and valence band $E_v$ for each nanowire section is this example is the same. The Fermi energy level $E_f$ of the third nanowire section 58-3 is higher than the Fermi energy level $E_f$ of the second nanowire section 58-2, which in turn in higher than the Fermi energy level $E_f$ of the first nanowire section 58-1. The doping concentration of the third nanowire section 58-3 is higher than the doping concentration of the second nanowire section 58-2, which in turn in higher than the doping concentration of the first nanowire section 58-1.

Figure 3C:
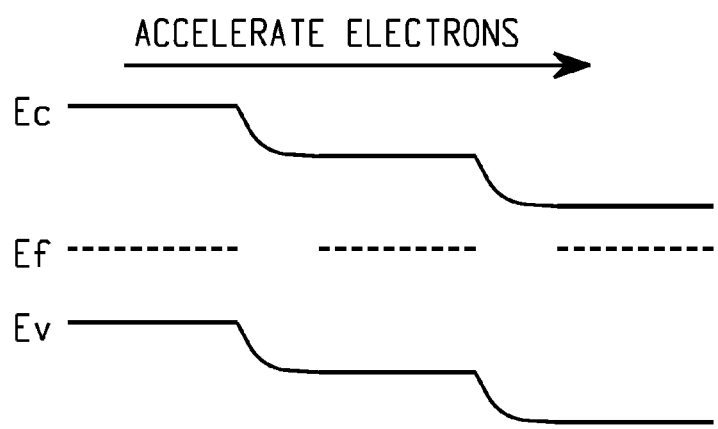
FIG. 3C is a diagram illustrating the relative levels of the conduction band energy $E_C$ and the valence band energy $E_v$ for the semiconductor device of FIG. 3A at different locations in the nanowire channel.

As illustrated in FIG. 3C, when the three nanowire sections are connected, their Fermi energy levels become equal causing the conduction band $E_c$ and valence band $E_v$ for each nanowire section to shift relative to each other. The doping differences in the three nanowire channel sections can cause the flow of electrons from the first nanowire section 58-1 to the second nanowire section 58-2 and finally to the third nanowire section 58-3 to accelerate. The carrier velocity will be enhanced by the induced electric field at each nanowire section interface.

Figure 4A:
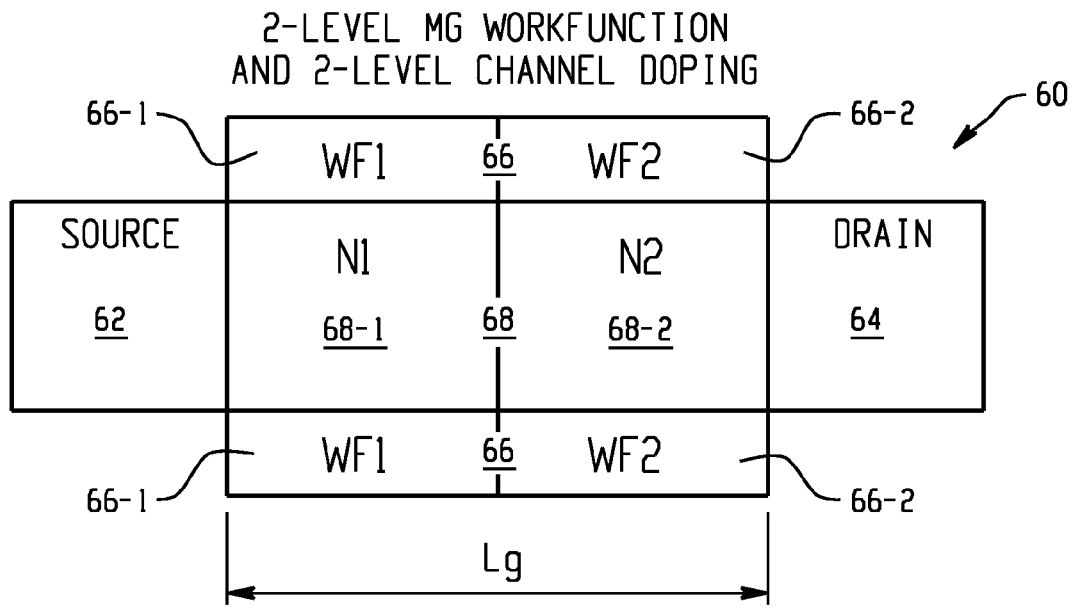
FIG. 4A is a diagram of another example semiconductor device having a channel formed from nanowire material.

FIG. 4A depicts another example semiconductor structure 60 that can be implemented using a nanowire. The semiconductor structure 60 comprises a source region 62, a drain region 64, and gate region 66 surrounding a nanowire structure 68. The gate region 66 has a total length Lg and includes a first gate section 66-1 and a second gate section 66-2. The first gate section 66-1 is configured with a first work function WF-1, and the second gate section 66-2 is configured with a second work function WF-2. The nanowire structure 68 includes a first nanowire section 68-1 and a second nanowire section 68-2.

Figure 4B:
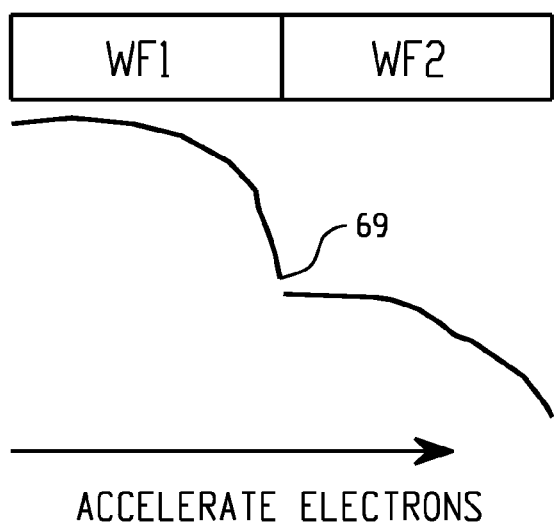
FIG. 4B is a diagram illustrating the relative levels of the conduction band energy $E_c$ for the semiconductor device of FIG. 4A at different locations in the nanowire channel.

FIG. 4B is a drawing that illustrates the effect of the different gate work functions on the conduction band energy $E_c$ of the nanowire channel and the effect of the different doping levels within the nanowire channel on the conduction band energy $E_c$. The first gate section 66-1 and the second gate section 66-2 are each doped at different levels to generate different work functions for the two gate sections, wherein the second gate section has a higher work function than the first gate section. The doping concentration of the second nanowire section 68-2 is higher than the doping concentration of the first nanowire section 68-1. The combination of the change in doping in the two nanowire channel sections and the change in doping in the two gate sections causes the conduction band energy stabilize at the interface 69 between the sections. The work function differences in the two gate sections and the doping differences in the two channel sections can cause the flow of electrons from the first gate section 66-1 to the second gate section 66-2 to accelerate. The carrier velocity will be enhanced by the induced electric field at the two gate section and two channel section interfaces.

Figure 5:
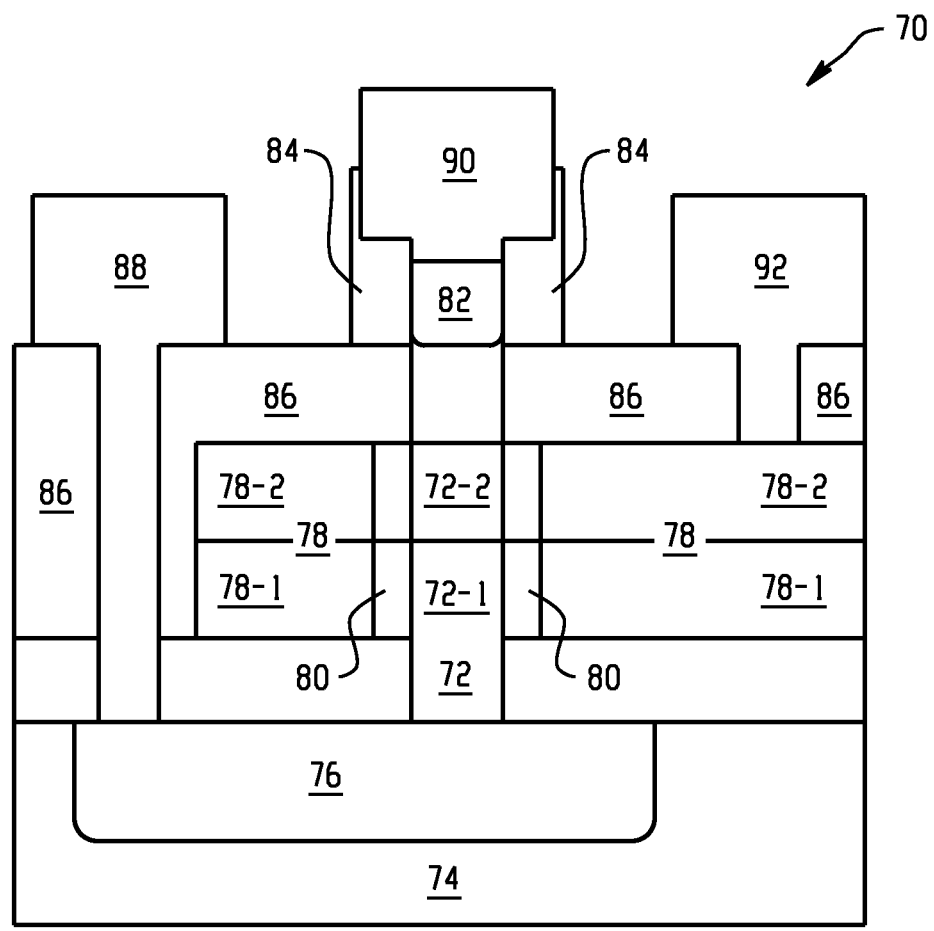
FIG. 5 is a cross sectional view of an example MOSFET semiconductor device with multi-level work function and multi-valued channel doping.

Depicted in FIG. 5 is a cross sectional view of an example MOSFET semiconductor device 70 that includes a nanowire 72 with multi-level channel doping and a gate 78 with multi-level work function. The example MOSFET semiconductor device 70 may be fabricated using suitable processes including photolithography, etching, cleaning, chemical mechanical polishing/planarization (CMP), thin film deposition, thermal process (e.g., doping, activation/surface, passivation/material consolidation), epitaxy, and material filling, among others. For example, the photolithography process may include forming a photoresist layer (resist), exposing the resist to a pattern, performing post-exposure bake processes, and developing the resist to form a masking element. The masking element may then be used in an etching process. The etching may be performed using reactive ion etch (RIE) and/or other suitable processes.

The example MOSFET semiconductor device 70 includes a silicon substrate 74 with a doped region 76 which functions as a source region. The nanowire 72 is formed above the source region 76 with a first doped portion 72-1 adjacent to the source region 76 a second doped portion 72-2 on the opposite end of the nanowire 72. Although the nanowire 72 shown in this example has two different doped portions, in other examples the nanowire 72 may have three or more different doped portions.

The example MOSFET semiconductor device 70 further includes gate material 78 including a Hi-K dielectric 80 surrounding a section of the nanowire 72 at the junction between the first doped 72-1 and the second doped portion 72-2. The gate material 78 is doped such that a first section 78-1 of the gate 78 has a first work function and a second section 78-2 of the gate 78 has a second work function. Although the gate 78 shown in this example has two different doped portions, in other examples the gate 78 may have three or more different doped portions. The example MOSFET semiconductor device 70 also includes a drain region 82 comprising silicide at the end of the nanowire 72 opposite the source region 76 and nitride spacers 84 surrounding the drain region 82. The MOSFET semiconductor device 70 also includes insulator material 86 and metal contacts. The metal contacts include a source contact 88, a gate contact 90, and a drain contact 92. Although shown is a NMOS device, in other examples a PMOS device could be implemented.

Figure 6:
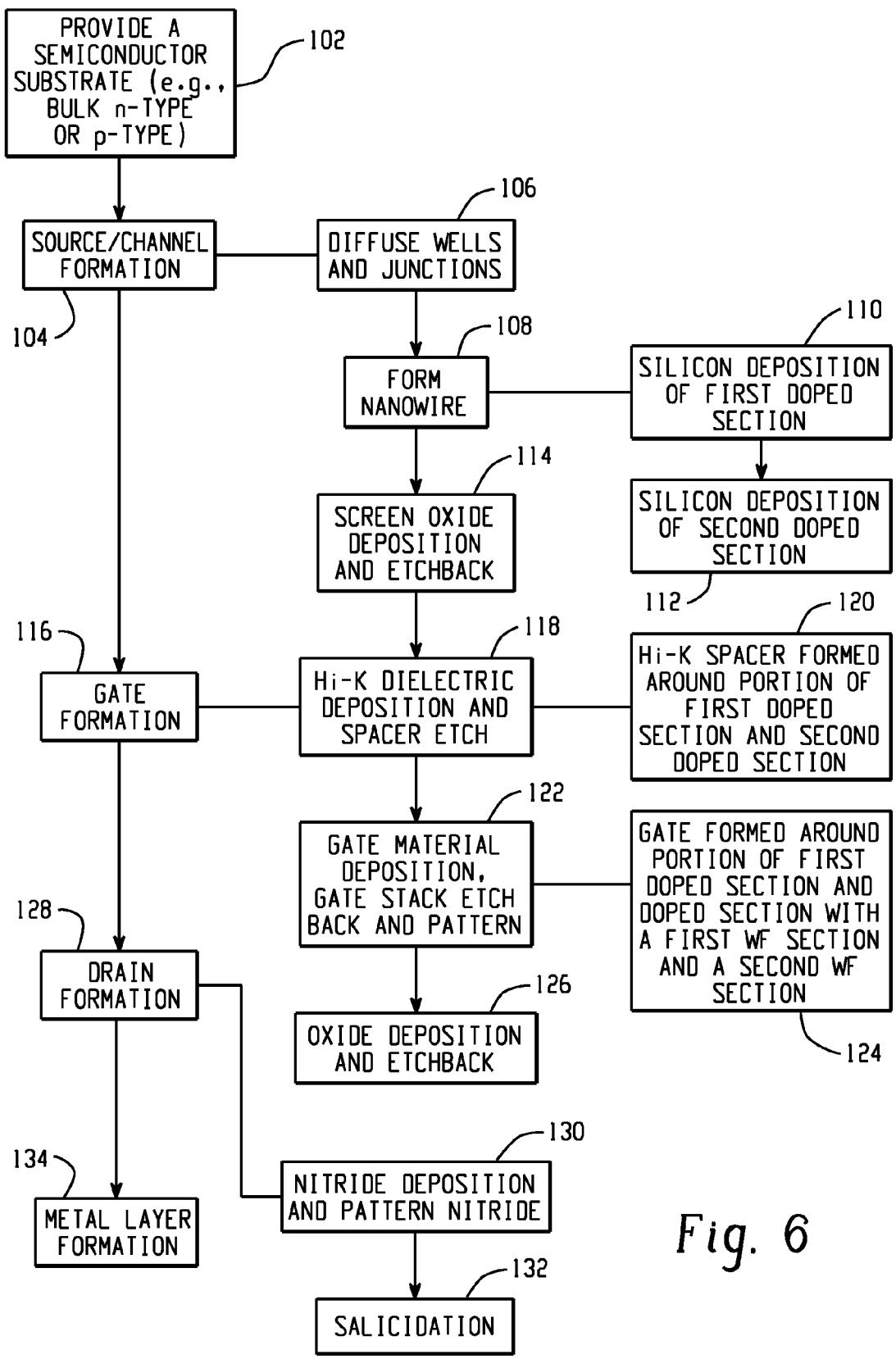
FIG. 6 is a process flow chart depicting an example method for generating a semiconductor device with multi-level work function and multi-valued channel doping.

FIG. 6 is a process flow chart depicting an example method for generating a semiconductor device structure having a nanowire with multi-level channel doping and a gate 78 with multi-level work function. This example illustrates a vertical process flow. A semiconductor substrate is provided (operation 102). The substrate may be a bulk substrate such as a bulk n-type or bulk p-type substrate. Other substrates may also be used such as a semiconductor-on-insulator substrate.

Figure 7:
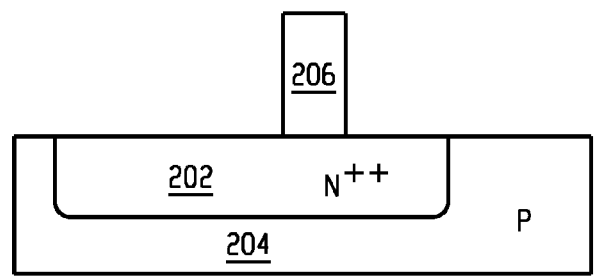
FIGS. 7-14 are drawings depicting example states of a semiconductor structure during fabrication of a semiconductor device with multi-level work function and multi-valued channel doping.

The source and channel regions of the semiconductor device are formed (operation 104). Source formation may involve operations such as well and junction diffusion (operation 106) and N+ and P+ implantation to form a source region in the semiconductor substrate. The channel region may be fabricated from one or more nanowires (operation 108). In this example, each nanowire has two doped channel sections, a first doped channel section and a second doped channel energy section. The first doped channel section is formed first (operation 110), for example, through deposition operations. FIG. 7 depicts a cross sectional view of a portion of a semiconductor device after source 202 formation in the substrate 204 and formation of the first doped channel section 206 of the nanowire. The first doped channel section 206 may be formed from a semiconductor material such as silicon or other suitable semiconductor material.

Figure 8:
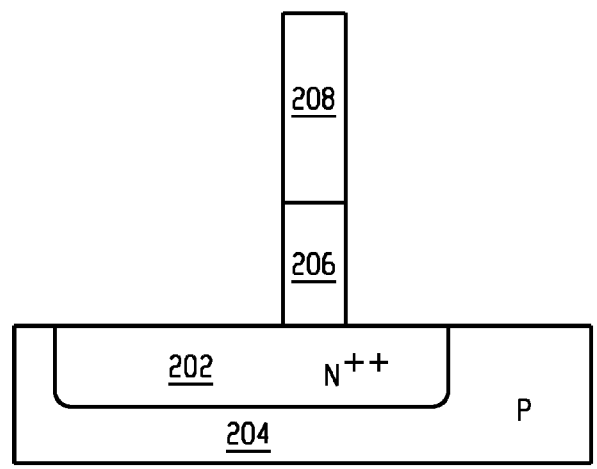

Referring back to FIG. 6, the second doped channel section of the nanowire is formed (operation 112), for example, using deposition operations. FIG. 8 depicts a cross sectional view of a portion of a semiconductor device after formation of the second doped channel section 208 of the nanowire. The second doped channel section 208 may be formed from a semiconductor material such as silicon or other suitable semiconductor material. The second doped channel section should be doped at a higher level than that of the first doped channel section.

Figure 9:
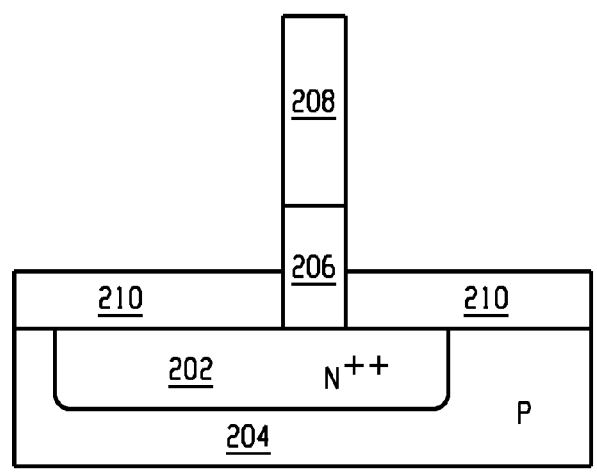

Referring back to FIG. 6, after the second doped channel section of the nanowire is formed, screen oxide deposition and etch back takes place (operation 114). FIG. 9 depicts a cross sectional view of a portion of a semiconductor device after deposition and etch back of screen oxide 210.

Figure 10:
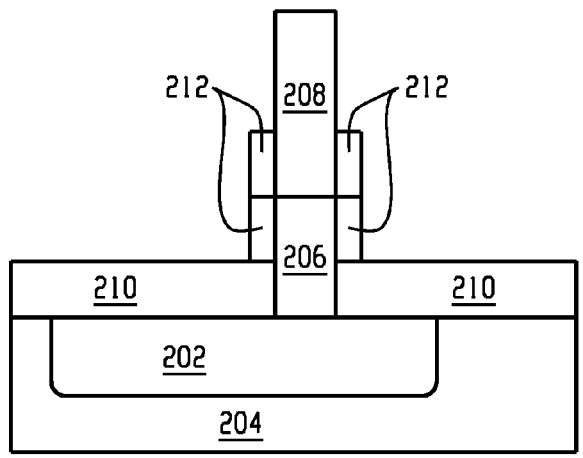

Referring back to FIG. 6, after source and channel formation, gate formation (operation 116) may take place. Gate formation may involve High-K dielectric deposition and patterning (operation 118). This operation may result in a High-K spacer formed around the junction of the first doped channel section and the second doped channel section (operation 120). FIG. 10 depicts a cross sectional view of a portion of a semiconductor device after High-K spacer formation around the junction of the first doped channel section 206 and the second doped channel section 208.

Figure 11:
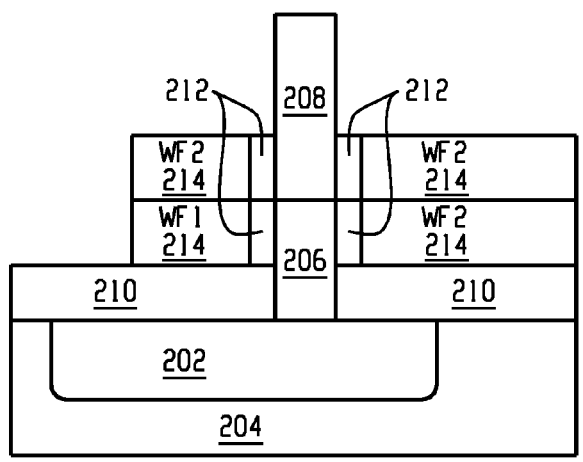

Referring back to FIG. 6, after High-K dielectric deposition and patterning, gate material deposition, gate stack etch back and gate stack patterning takes place (operation 122). This results in a transistor gate being formed around the junction of the first doped channel section and the second doped channel section (operation 124). The gate material is doped resulting in a first doped gate section and a second doped gate section, each doped gate section has a different work function. FIG. 11 depicts a cross sectional view of a portion of a semiconductor device after formation of the gate 214 with a first work function section WF1 and a second work function section WF2.

Figure 12:
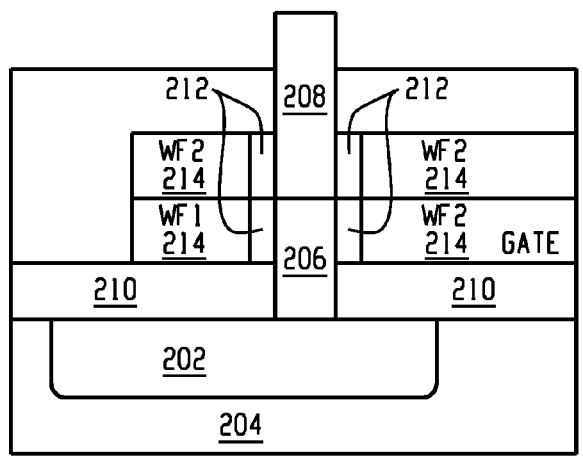

Referring back to FIG. 6, after gate stack patterning, oxide deposition and etch back operations takes place (operation 126). FIG. 12 depicts a cross sectional view of a portion of a semiconductor device after oxide deposition and etch back showing deposited oxide 216.

Figure 13:
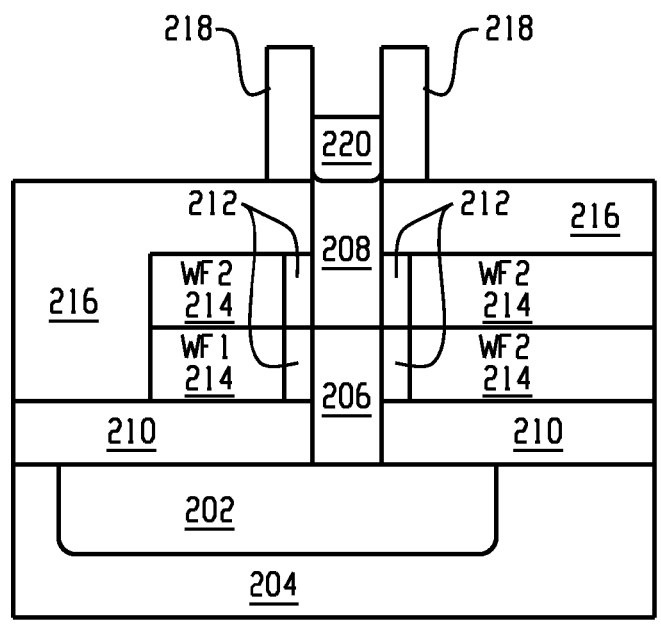

Referring back to FIG. 6, after gate formation and oxide deposition, drain formation may occur (operation 128). Drain formation may involve nitride spacer formation (operation 130). This may involve nitride deposition and patterning operations. FIG. 13 depicts a cross sectional view of a portion of a semiconductor device after nitride patterning and illustrates the deposited nitride spacers 218.

Figure 14:
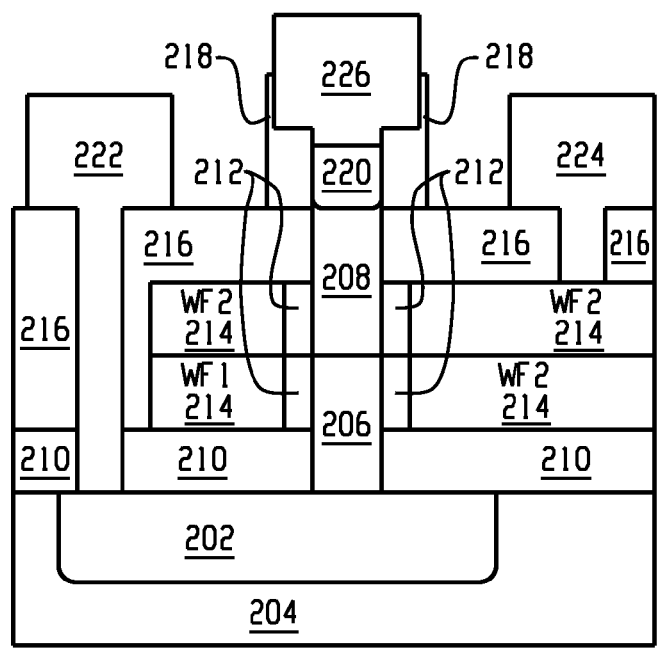

Referring back to FIG. 6, after nitride patterning, salicidation operations take place (operation 132) wherein silicide is formed at the end of the nanowire section opposite the substrate. Finally, metallization operations (operation 134) are shown where metal contacts are added to the drain, source, and gate regions of the transistor device. FIG. 14 depicts a cross sectional view of a portion of a semiconductor device after salicidation and metallization. The figure illustrates silicide 220 formed at the end of the second nanowire section 208 opposite the substrate 204 and metal contacts added to the drain, source, and gate regions of the transistor device. Shown are source contact 222, gate contact 224, and drain contact 226.

FIG. 6 describes a process for fabricating a MOSFET having multi-level doping of the nanowire channel with the doping level changing from a high channel doping level to a lower channel doping level from source side to drain side within the channel. Also the work function level changes from a high work function level to a lower work function level from the source side to the drain side within the channel. The multi-level work function or multi-valued channel doping may induce a channel electric field change at the multi-level work function or multi-valued channel doping interfaces. The carrier velocity will be enhanced by the induced channel electric field. The multi-level work function and multi-valued channel doping can be optimized simultaneously to enhance drive current.

The channel electric field can be enhanced to accelerate carrier transit from source to drain by the multi-level work function. The channel electric field can also be enhanced to accelerate carrier transit from source to drain by the multi-valued channel doping. The channel electric field can be enhanced by the combination of the multi-level work function and the multi-valued channel doping.

Figure 15:
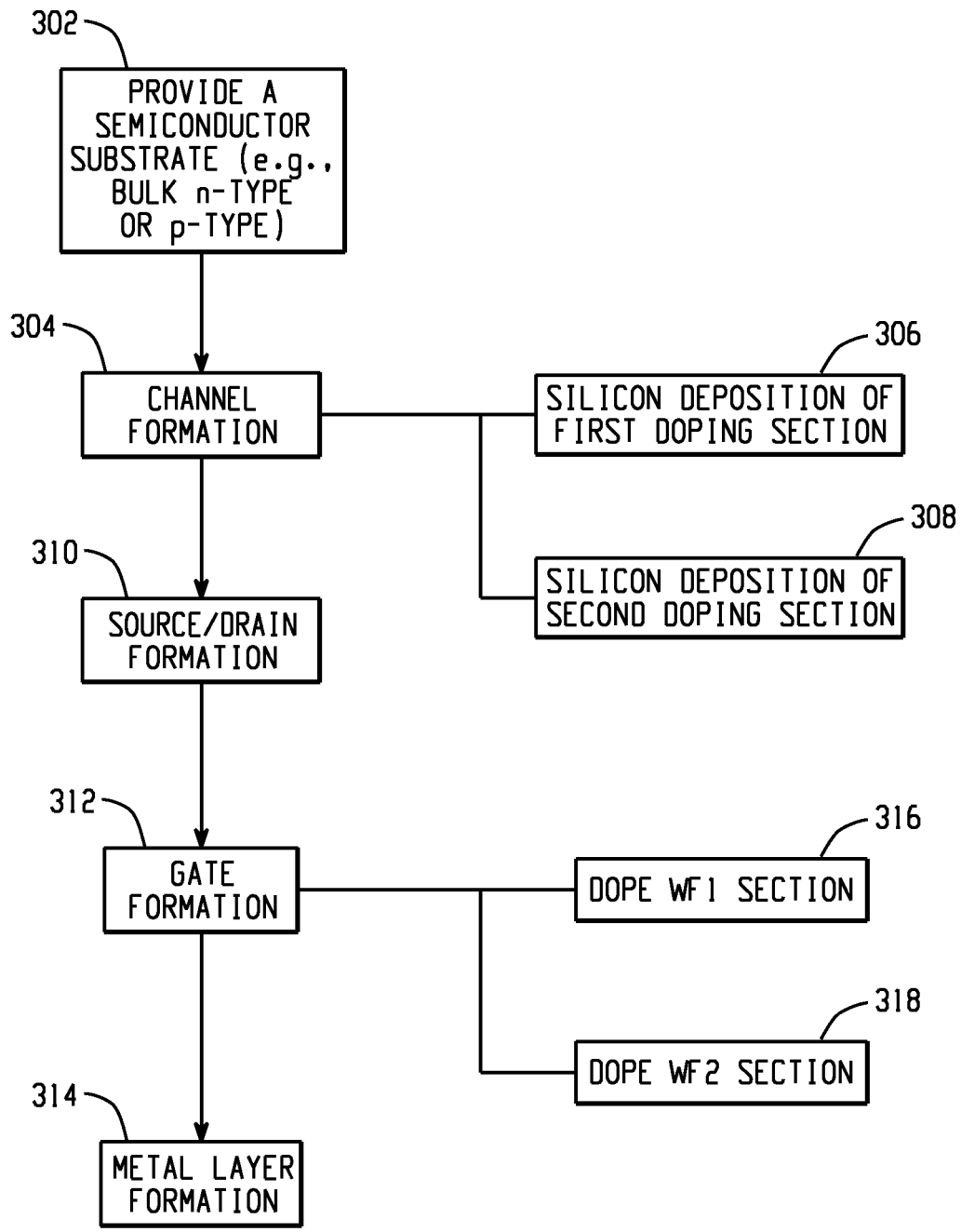
FIG. 15 is a process flow chart depicting another example method for generating a semiconductor device with multi-level work function and multi-valued channel doping.

FIG. 15 is a process flow chart depicting another example method for generating a semiconductor device structure having a nanowire with multi-level band gap energy. This example illustrates a process flow to make a horizontal device. A semiconductor substrate is provided (operation 302). The substrate may be a bulk substrate such as a bulk n-type or bulk p-type substrate. Other substrates may also be used such as a semiconductor-on-insulator substrate. The channel region of the semiconductor device is formed (operation 304). In this example, the channel region is formed by a nanowire with two different doping levels, which create a first doping section and a second doping section (operations 306 and 308). Each doping section is formed, for example, through deposition operations. The source and drain regions are formed (operation 310) as well as nitride spacers.

Figure 16A:
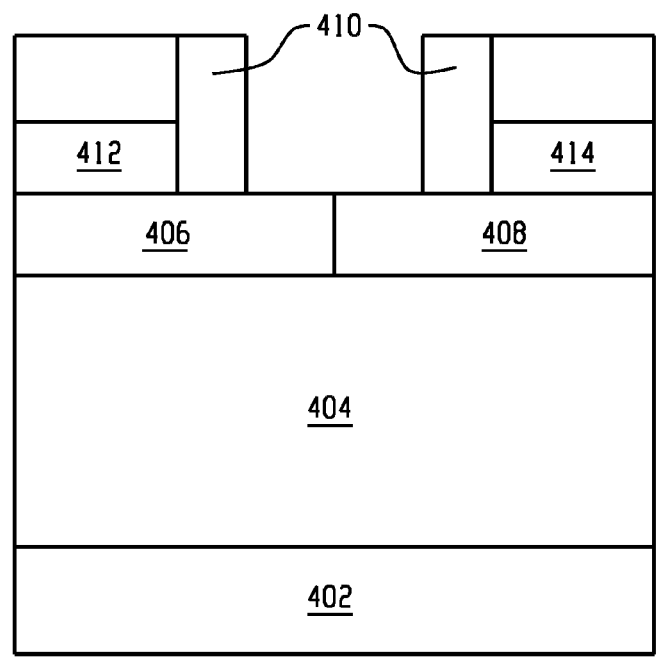
FIGS. 16A, 16B, 17A and 17B are drawings depicting example states of a semiconductor structure during fabrication of a semiconductor device with multi-level work function and multi-valued channel doping.
Figure 16B:
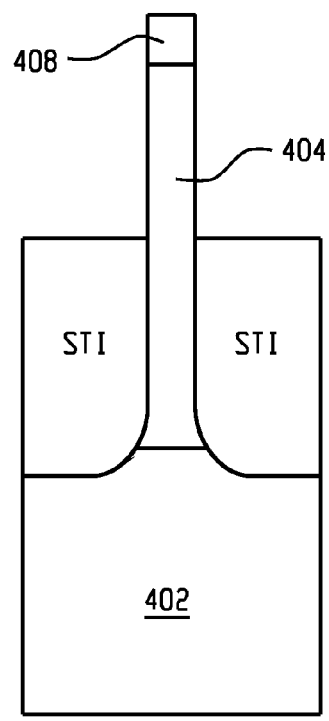

FIG. 16A is a cross sectional view along the channel length of an example semiconductor structure during fabrication. Shown are the silicon substrate 402, silicon geranium 404 above the silicon, a first doped channel section 406 and a second doped channel section 408 of the channel, spacers 410, the source region 412 and the drain region 414. FIG. 16B is a cross sectional view along the channel width of the example semiconductor structure of FIG. 16A.

Referring back to FIG. 15, Gate formation (operation 312) takes place and may involve etching operations to clear an area for the gate. Gate formation may involve High-K dielectric deposition and patterning and well as gate material deposition and doping. This may result in a High-K dielectric spacer formed around the junction of the first channel doping section and the second channel doping section and gate material with a first work function section WF1 and a second work function section WF2 formed over the High-K dielectric material.

Figure 17A:
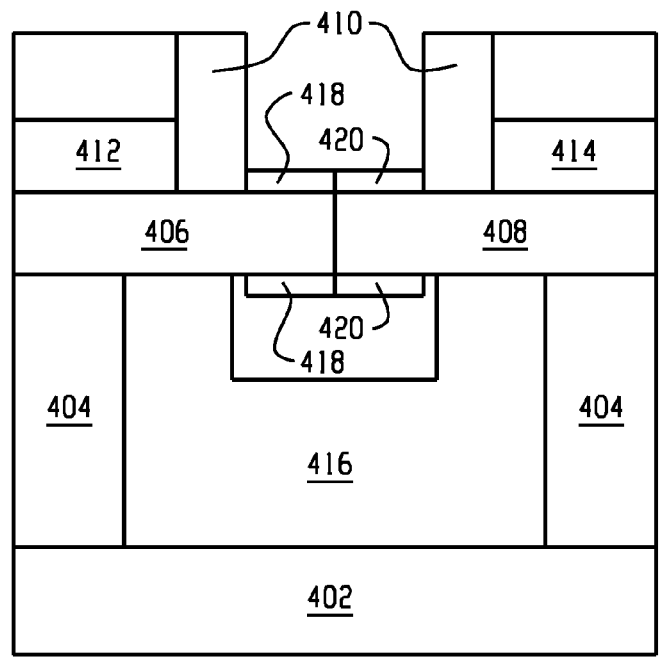
Figure 17B:
Figure 17B:
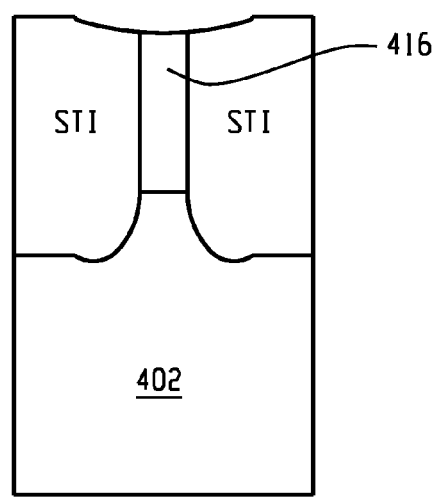

FIG. 17A is a cross sectional view along the channel length of the example semiconductor structure after gate formation. This figure shows silicon geranium oxide 416 formed on the substrate and a first work function section 418 and a second work function section 420 formed around the junction of the first doped channel section 406 and the second doped channel section 408. FIG. 17B is a cross sectional view along the channel width of the example semiconductor structure of FIG. 17A.

Referring back to FIG. 15, metallization operations (operation 314) may take place during which metal contacts are added to the drain, source, and gate regions of the transistor device.

Implementation of the described techniques may improve (increase) the channel electric field, may improve carrier velocity, and may improve drive current without additional power consumption or boosting the supply voltage.

The described techniques use different channel dopings and different work functions to induce gradient channel electric field variations within the channel to enhance drive current. Two different process approaches are described: a horizontal and a vertical process, each of which may achieve the multi-level work function and multi-valued doping.

In one embodiment, a semiconductor device with multi-level work function and multi-valued channel doping is provided. The example semiconductor device comprises a nanowire structure and a gate region. The nanowire structure is formed as a channel between a source region and a drain region. The nanowire structure has a first doped channel section joined with a second doped channel section. The first doped channel section is coupled to the source region and has a doping concentration greater than the doping concentration of the second doped channel section. The second doped channel section is coupled to the drain region. The gate region is formed around the junction at which the first doped section and the second doped section are joined. The gate region has a first work function gate section joined with a second work function gate section. The first work function gate section is located adjacent to the source region and has a work function greater than the work function of the second work function gate section. The second work function gate section located adjacent to the drain region.

These aspects and other embodiments may include one or more of the following features. The nanowire structure may further comprise a third doped channel section. The third doped channel section may be coupled between the second doped channel section and the drain region. The third doped channel section may have a doping concentration less than the doping concentration of the second doped channel section. The nanowire structure may further comprise a third work function gate section. The second work function gate section may be coupled between the third work function gate section and the first work function gate section. The third work function gate section may have a work function less than the work function of the second work function gate section.

In another embodiment, a method of forming a semiconductor device with multi-level work function and multi-valued channel doping is provided. The example method comprises forming a nanowire structure and a gate region. The nanowire structure is formed as a channel between a source region and a drain region. The nanowire structure has a first doped channel section joined with a second doped channel section. The first doped channel section is coupled to the source region and has a doping concentration greater than the doping concentration of the second doped channel section. The second doped channel section is coupled to the drain region. The gate region is formed around the junction at which the first doped section and the second doped section are joined. The gate region has a first work function gate section joined with a second work function gate section. The first work function gate section is located adjacent to the source region and has a work function greater than the work function of the second work function gate section. The second work function gate section located adjacent to the drain region.

These aspects and other embodiments may include one or more of the following features. The nanowire structure may further comprise a third doped channel section. The third doped channel section may be coupled between the second doped channel section and the drain region. The third doped channel section may have a doping concentration less than the doping concentration of the second doped channel section. The nanowire structure may further comprise a third work function gate section. The second work function gate section may be coupled between the third work function gate section and the first work function gate section. The third work function gate section may have a work function less than the work function of the second work function gate section.

In another embodiment, a method of forming a semiconductor device with multi-valued channel doping is provided. The example method comprises forming a nanowire structure and a gate region. The nanowire structure is formed as a channel between a source region and a drain region. The nanowire structure has a first doped channel section joined with a second doped channel section. The first doped channel section is coupled to the source region and has a doping concentration greater than the doping concentration of the second doped channel section. The second doped channel section is coupled to the drain region. The gate region is formed around the junction at which the first doped section and the second doped section are joined.

These aspects and other embodiments may include one or more of the following features. The nanowire structure may further comprise a third doped channel section. The third doped channel section may be coupled between the second doped channel section and the drain region. The third doped channel section may have a doping concentration less than the doping concentration of the second doped channel section. The gate region may comprise a High-K dielectric material and metal gate material. The High-K dielectric material may be formed around the junction at which the first and second doped channel sections are joined. The nanowire structure may extend vertically away from a substrate.

In another embodiment, a method of forming a semiconductor device with multi-level work function is provided. The example method comprises forming a nanowire structure and a gate region. The nanowire structure is formed as a channel between a source region and a drain region. The gate region is formed around a portion of the nanowire channel. The gate region has a first work function gate section joined with a second work function gate section. The first work function gate section is located adjacent to the source region and has a work function greater than the work function of the second work function gate section. The second work function gate section is located adjacent to the drain region.

These aspects and other embodiments may include one or more of the following features. The gate region may further comprise a third work function gate section. The second work function gate section may be coupled between the third work function gate section and the first work function gate section. The third work function gate section may have a work function less than the work function of the second work function gate section. The nanowire structure may extend vertically away from a substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
 a nanowire structure formed as a channel between a source region and a drain region, the nanowire structure having a first doped channel section joined with a second doped channel section, the first and second doped channel sections comprising silicon doped with an n-type dopant or a p-type dopant, the first doped channel section being coupled to the source region and having a doping concentration greater than the doping concentration of the second doped channel section, the second doped channel section coupled to the drain region, wherein the nanowire structure extends parallel to a surface of an underlying substrate; and
 a gate region formed around the junction at which the first doped section and the second doped section are joined.

2. The semiconductor device of claim 1, wherein the nanowire structure further comprises a third doped channel section, the third doped channel section being coupled between the second doped channel section and the drain region, the third doped channel section having a doping concentration less than the doping concentration of the second doped channel section.

3. The semiconductor device of claim 1, wherein the gate region comprises High-K dielectric material and metal gate material and wherein the High-K dielectric material is formed around the junction at which the first and second doped channel sections are joined.

4. A semiconductor device comprising:
 a nanowire structure formed as a channel between a source region and a drain region, wherein the nanowire structure extends parallel to a surface of an underlying substrate, and wherein the nanowire structure has a first doped channel section joined with a second doped channel section, the first and second doped channel sections comprising silicon doped with an n-type dopant or a p-type dopant, the first doped channel section being coupled to the source region and having a doping concentration greater than a doping concentration of the second doped channel section, the second doped channel section being coupled to the drain region; and
 a gate region formed around a portion of the nanowire channel, the gate region having a first work function gate section joined with a second work function gate section, the first work function gate section located adjacent to the source region and having a work function greater than the work function of the second work function gate section, the second work function gate section located adjacent to the drain region.

5. The semiconductor device of claim 4, wherein the gate region further comprises a third work function gate section, the second work function gate section being coupled between the third work function gate section and the first work function gate section, the third work function gate section having a work function less than the work function of the second work function gate section.

6. The semiconductor device of claim 4, wherein the nanowire structure further comprises a third doped channel section, the third doped channel section being coupled between the second doped channel section and the drain region, the third doped channel section having a doping concentration less than the doping concentration of the second doped channel section.

7. The semiconductor device of claim 4, wherein the gate region further comprises a third work function gate section, the second work function gate section being coupled between the third work function gate section and the first work function gate section, the third work function gate section having a work function less than the work function of the second work function gate section.

8. A semiconductor device, comprising:
 a nanowire channel structure arranged between a first doped region and a second doped region, the nanowire channel structure comprising a gradient channel dopant profile, wherein the nanowire channel structure extends parallel to a surface of an underlying substrate and comprises silicon doped with an n-type dopant or a p-type dopant; and
 a gate structure surrounding at least a portion of the nanowire channel structure, the gate structure comprising a gradient work function profile,
 wherein the gradient channel dopant profile and the gradient work function profile cooperatively induce gradient channel electric field variation in the channel to enhance drive current through the nanowire channel structure of the semiconductor device.

9. The device of claim 8, wherein the gradient channel dopant profile comprises higher dopant concentration toward the second doped region.

10. The device of claim 9, wherein the nanowire channel structure comprises a first doped channel section coupled to the first doped region connected to a second doped channel section coupled to the second doped region, wherein the second doped channel section has a second dopant concentration higher than a first dopant concentration of the first doped channel section.

11. The device of claim 10, further comprising at least one intermediate doped channel section coupled between the first and the second doped channel sections, wherein a dopant concentration of the intermediate doped channel section is between the first and the second dopant concentrations, wherein the dopant concentration differences of the doped channel sections of the nanowire structure generate the gradient channel dopant profile that increases toward the second doped region.

12. The device of claim 8, wherein the gradient work function profile comprises higher work function toward the second doped region.

13. The device of claim 12, wherein the gate structure comprises a first work function gate section arranged toward the first doped region connected to a second work function gate section arranged toward the second doped region, wherein the second work function gate section has a work function greater than that of the first work function gate section.

14. The device of claim 13, further comprising at least one intermediate work function gate section arranged between the first and the second work function gate sections, wherein the work function of the intermediate work function gate section is between that of the first and the second work function gate sections, wherein the work function differences of the work function gate sections of the gate structure generate the gradient work function profile that increases toward the second doped region.

15. The device of claim 8, wherein the gate structure comprises a metal gate stack.

* * * * *